(12) United States Patent
Abiko et al.

(10) Patent No.: US 9,070,444 B2
(45) Date of Patent: Jun. 30, 2015

(54) SEMICONDUCTOR MEMORY DEVICE

(71) Applicant: KABUSHIKI KAISHA TOSHIBA, Minato-ku (JP)

(72) Inventors: Naofumi Abiko, Kawasaki (JP); Masahiro Yoshihara, Yokohama (JP); Akio Sugahara, Yokohama (JP); Yoshikazu Harada, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 66 days.

(21) Appl. No.: 13/948,792

(22) Filed: Jul. 23, 2013

(65) Prior Publication Data

US 2014/0241072 A1 Aug. 28, 2014

Related U.S. Application Data

(60) Provisional application No. 61/770,739, filed on Feb. 28, 2013.

(51) Int. Cl.
*G11C 7/10* (2006.01)
*G11C 16/04* (2006.01)
*G11C 16/30* (2006.01)
*G11C 5/14* (2006.01)

(52) U.S. Cl.
CPC ............ *G11C 16/0483* (2013.01); *G11C 16/30* (2013.01); *G11C 2207/2227* (2013.01); *G11C 5/148* (2013.01)

(58) Field of Classification Search
CPC .. G11C 7/1048; G11C 16/0483; G11C 5/148; G11C 16/30; G11C 2207/2227

USPC ............ 365/185.03, 185.05, 185.23, 185.24, 365/189.05, 189.09, 230.06
See application file for complete search history.

(56) References Cited

U.S. PATENT DOCUMENTS

| | | | |
|---|---|---|---|
| 6,891,753 B2 | 5/2005 | Cernea | |
| 7,110,296 B2 | 9/2006 | Lee | |
| 7,701,763 B2* | 4/2010 | Roohparvar | 365/185.09 |
| 2009/0268520 A1* | 10/2009 | Roohparvar | 365/185.09 |
| 2011/0141814 A1 | 6/2011 | Abiko | |
| 2012/0250425 A1 | 10/2012 | Yoshihara et al. | |
| 2013/0322171 A1* | 12/2013 | Lee et al. | 365/185.03 |

FOREIGN PATENT DOCUMENTS

| | | |
|---|---|---|
| JP | 2005-190648 | 7/2005 |
| JP | 2006-500731 | 1/2006 |
| JP | 2011-129176 | 6/2011 |
| JP | 2012-212479 | 11/2012 |

* cited by examiner

*Primary Examiner* — Gene Auduong
(74) *Attorney, Agent, or Firm* — Oblon, McClelland, Maier & Neustadt, L.L.P.

(57) ABSTRACT

A semiconductor memory device includes a memory cell array including memory cells arranged therein. A first latch circuit temporarily holds data to perform a read operation and a write operation on the memory cell array. The second latch circuit temporarily holds a control signal. A control circuit controls the memory cell array, the first latch circuit and the second latch circuit. The control circuit limits an operation of the first latch circuit in a state after an operation on the memory cell array has been finished, and limits an operation of the second latch circuit based on a command supplied from external.

18 Claims, 8 Drawing Sheets

US 9,070,444 B2

SEMICONDUCTOR MEMORY DEVICE

CROSS REFERENCE TO RELATED APPLICATIONS

This application is based on and claims the benefit of priority from prior U.S. Provisional Patent Application No. 61/770,739, filed on Feb. 28, 2013, the entire contents of which are incorporated herein by reference.

FIELD

Embodiments described herein relate to a semiconductor memory device.

BACKGROUND

Semiconductor memory devices such as NAND type flash memory are used as data storage units in portable electronic devices such as cell-phone terminals or portable music record players, and other various electronic devices. Reduction in power consumption is required in such semiconductor memory devices.

DETAILED DESCRIPTION

Semiconductor memory devices according to embodiments explained below has a memory cell array including memory cells arranged therein. A first latch circuit is operative to temporarily hold data to perform a read operation and a write operation on the memory cell array. A second latch circuit is operative to temporarily hold a control signal. A control circuit is configured to control the memory cell array, the first latch circuit and the second latch circuit. The control circuit is operative to limit an operation of the first latch circuit in a state after an operation to the memory cell array has been finished, and limit an operation of the second latch circuit based on a command supplied from external.

First Embodiment

Schematic Configuration

Figure 1:
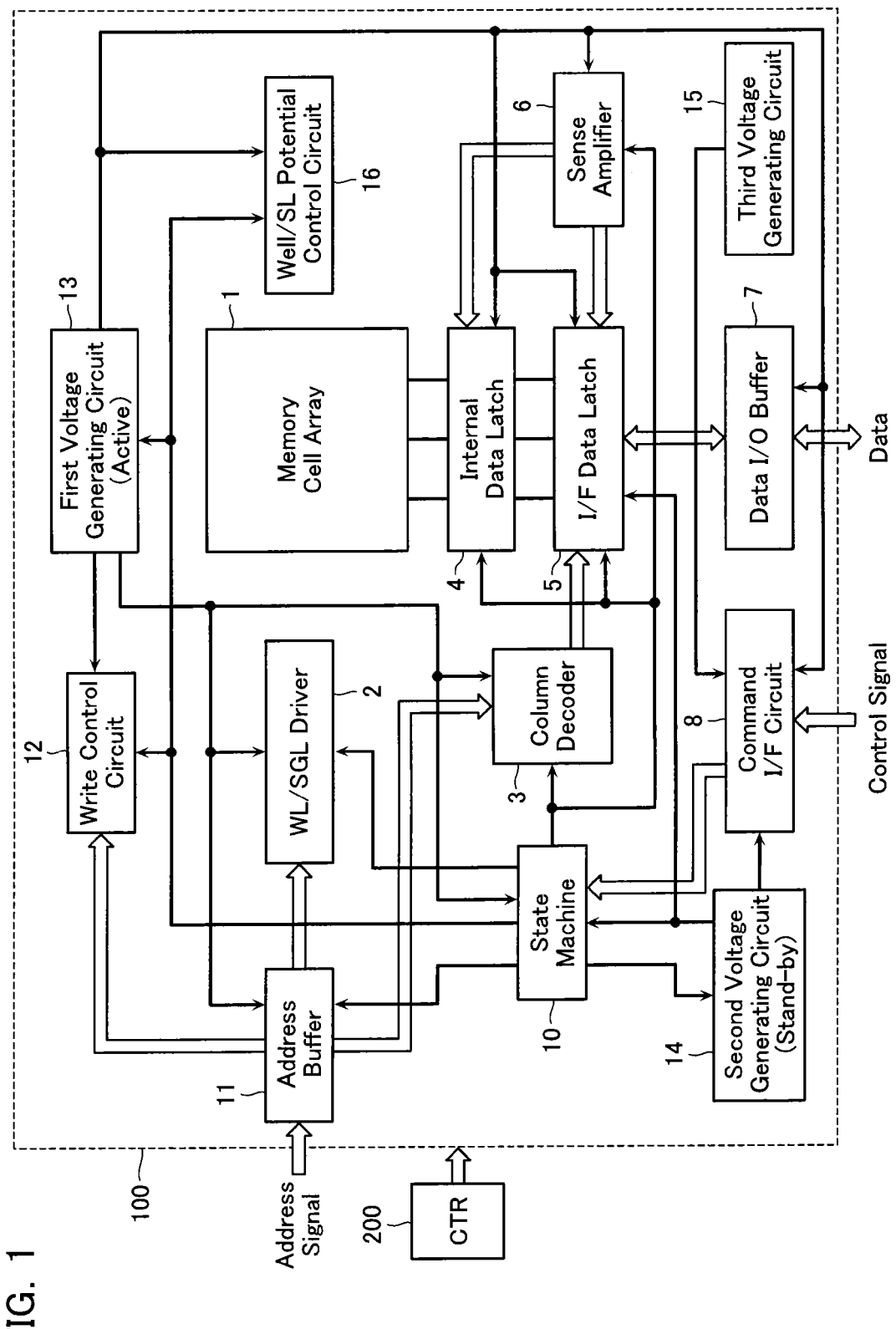
FIG. 1 is a block diagram of a nonvolatile semiconductor memory device (NAND type flash memory) according to the first embodiment.

FIG. 1 is a block diagram of a nonvolatile semiconductor memory device (NAND type flash memory) according to the first embodiment. As shown in FIG. 1, a nonvolatile semiconductor memory device comprises a memory chip 100 and a memory controller 200. The memory chip 100 is a semiconductor chip including a memory cell array, as described below. Also, the memory controller 200 is an external controller for controlling the memory chip 100.

The memory chip 100 comprises a memory cell array 1, a word line/select gate-line driver 2, a column decoder 3, an internal data latch 4, an interface data latch 5, a sense amplifier circuit 6, a data input/output buffer 7, a command interface circuit 8, a state machine 10, an address buffer 11, a write control circuit 12, a first voltage generating circuit 13, a second voltage generating circuit 14, a third voltage generating circuit 15 and a well/source-line potential control circuit 16.

Figure 2:
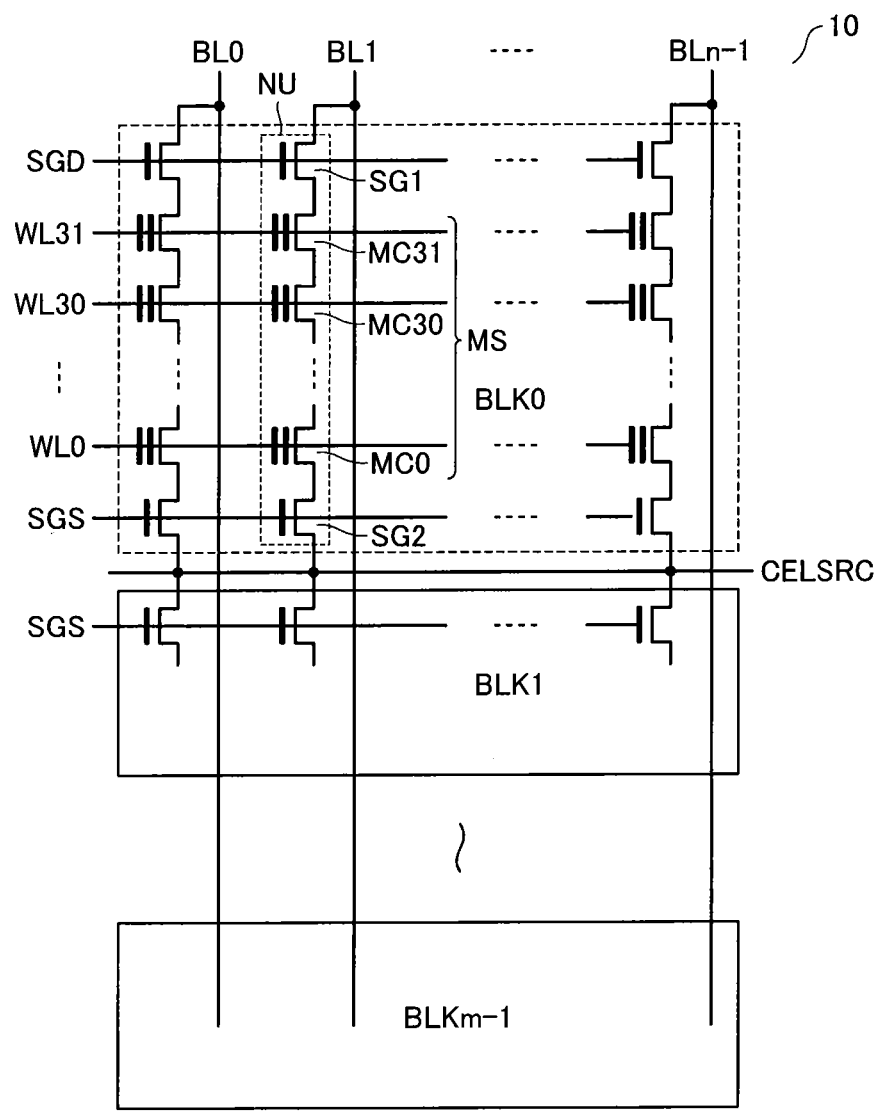
FIG. 2 illustrates a configuration example of a memory cell array 1.

As shown in FIG. 2, the memory cell array 1 includes a plurality of NAND cell units NU. One NAND cell unit NU is configured by a memory string MS that includes a plurality of memory cells MC (MC0, MC1, . . . , MC31) connected in series, and select gate transistors SG1, SG2 connected to both ends of the memory string MS. A memory cell MC is configured to be capable of storing, in a non-volatile manner, an erase state where data is erased therefrom, and a write state where data is written thereto. As an example, it has a floating gate structure with a floating gate as a charge storage film.

Note that, a dummy cell may be provided between the outermost memory cell MC0 or MC31 and a select gate transistor SG1 or SG2. The dummy cell may have a structure that is the same as that of the memory cell MC. The dummy cell is not used for data storage.

Although not shown, as is well known, one memory cell MC is configured to have a floating gate electrode as a charge storage layer on a gate insulating film (a tunnel insulating film) formed between a drain and a source, on which a control gate electrode is formed over the floating gate electrode via an insulating film. The control gate is connected to one of the word lines WL.

A source of the select gate transistor SG2 is connected to a source line CELSRC, and a drain of the select gate transistor SG1 is connected to a bit line BL. Control gates of the memory cells MC in the NAND cell unit NU are connected to different word lines WL (WL0, WL1, . . . , WL31), respectively. The select gate transistors SG1 and SG2 have gates connected to select gate lines SGD, SGS respectively. The select gate lines SGD and SGS run in parallel with the word lines WL. A group of a plurality of the memory cell MC sharing one word line WL configure one page or two pages. A group of a plurality of the NAND cell units 10 sharing the word lines W1 and the select gate lines SG1, SG2 configures a block as a unit of data erase.

The memory cell array 1 has a plurality of blocks BLK (BLK0, BLK1, . . . BLKm−1 . . . ) arranged in a direction of extension of the bit lines BL. The memory cell array 1 including these plural blocks BLK is formed in a cell well CPWELL formed in a silicon substrate.

The word line/select gate-line driver 2 selects a word line WL and a select gate line SG1, SG2 specified according to a row address signal. The column decoder 3 generates a signal for driving a column specified according to a column address signal.

The internal data latch 4 temporarily holds a signal read from the memory cell array 1 via the bit line BL and the sense amplifier circuit 6, and has a function to temporarily hold data provided from the data input/output buffer 7 through the interface data latch 5.

The interface data latch 5 has a function to temporarily hold a signal provided from the column decoder 3, as well as a control signal provided from external. In addition, the interface data latch 5 has a function to temporarily hold data provided from the memory controller 200 via the data input/output buffer 7, before delivering it to the internal data latch 4. Furthermore, the interface data latch 5 has a function to temporarily hold a signal read from the memory cell array 1 via the bit line BL and the sense amplifier circuit 6. The sense amplifier circuit 6 has a function to detect and amplify a signal read from the bit line BL. The data input/output buffer 7 has a function to temporarily hold data provided from the memory controller 200, and temporarily hold data provided from the internal data latch 4 and the interface data latch 5 to output it to external.

The command interface circuit 8 has a function to temporarily hold a control signal (a command) provided from the memory controller 200, and transfer the received command to the state machine 10. The state machine 10 has a function to control the word line/select gate-line driver 2, the column decoder 3, the internal data latch 4, the interface data latch 5, the sense amplifier circuit 6, the write control circuit 12, the first voltage generating circuit 13 and the second voltage generating circuit 14, according to a given command.

The address buffer 11 has a function to temporarily hold address data provided from the memory controller 200. Also, the write control circuit 12 controls a sequence of a write operation according to given address data and the control signal.

The first voltage generating circuit 13 is a circuit that supplies a voltage for operating circuits in a condition where a read operation, a write operation or an erase operation is performed in the memory cell array 1 (an active state).

Also, the second voltage generating circuit 10 is a circuit that supplies a voltage to the interface data latch 5, the data input/output buffer 7, the command interface circuit 8 and the state machine 10 in a normal stand-by state after the active state is over. In the normal stand-by state, some circuits including the internal data latch 4, the address buffer 11 and the like are forced to be in a non-active state for reduction in power consumption. The third voltage generating circuit 15 is a circuit that supplies a voltage only to the command interface circuit 8, for example, in a deep stand-by state after the normal stand-by state. That is, the third voltage generating circuit 15 is configured to continue generating a voltage irrespective of whether the command for ordering a shift to the deep stand-by state has been generated or not. Here, the normal stand-by state is a condition where a command for ordering an operation such as read, write, erase and the like has not been issued after the active state is over, and is a condition where some circuits such as the internal data latch 4 are in a non-active state. The deep stand-by state is a condition where only commands are accepted from the memory controller 200, and the other circuits are in a non-active state.

In the structure of FIG. 1, the internal data latch 4 temporarily holds data read from the memory cell array 1 through the sense amplifier circuit 6, and data supplied from the memory controller 200 for writing to the memory cell array 1. Thus, data held in the internal data latch 4 is destroyed when operation of the internal data latch 4 stops in the normal stand-by state, and supply of electric current is restrained. However, no problem arises even if the data held in the internal data latch 4 is broken, because after operation thereof is restarted, operation conducted before the restart is repeated, thereby the same data may be obtained. However, there is a risk that when the supply of electric current to the interface data latch 5 is restrained and data held therein is destroyed, it might be an obstacle to an operation after returning to the active state.

However, in this embodiment, the following configuration may allow a current supply to the interface data latch 5 to be restrained. That is, this embodiment shifts to a deep stand-by state according to a control signal (a command) from the memory controller 200, the deep stand-by state being a state where supply of electric current to the interface data latch 5 is also stopped or restrained. Shift to the deep stand-by state may destroy data held in the interface data latch 5. However, the memory controller 200 may judge how various types of operations are going. Accordingly, as far as supply of current to the interface data latch 5 is stopped according to a command, it does not affect whether various types of operations end up in success or not.

Figure 3:
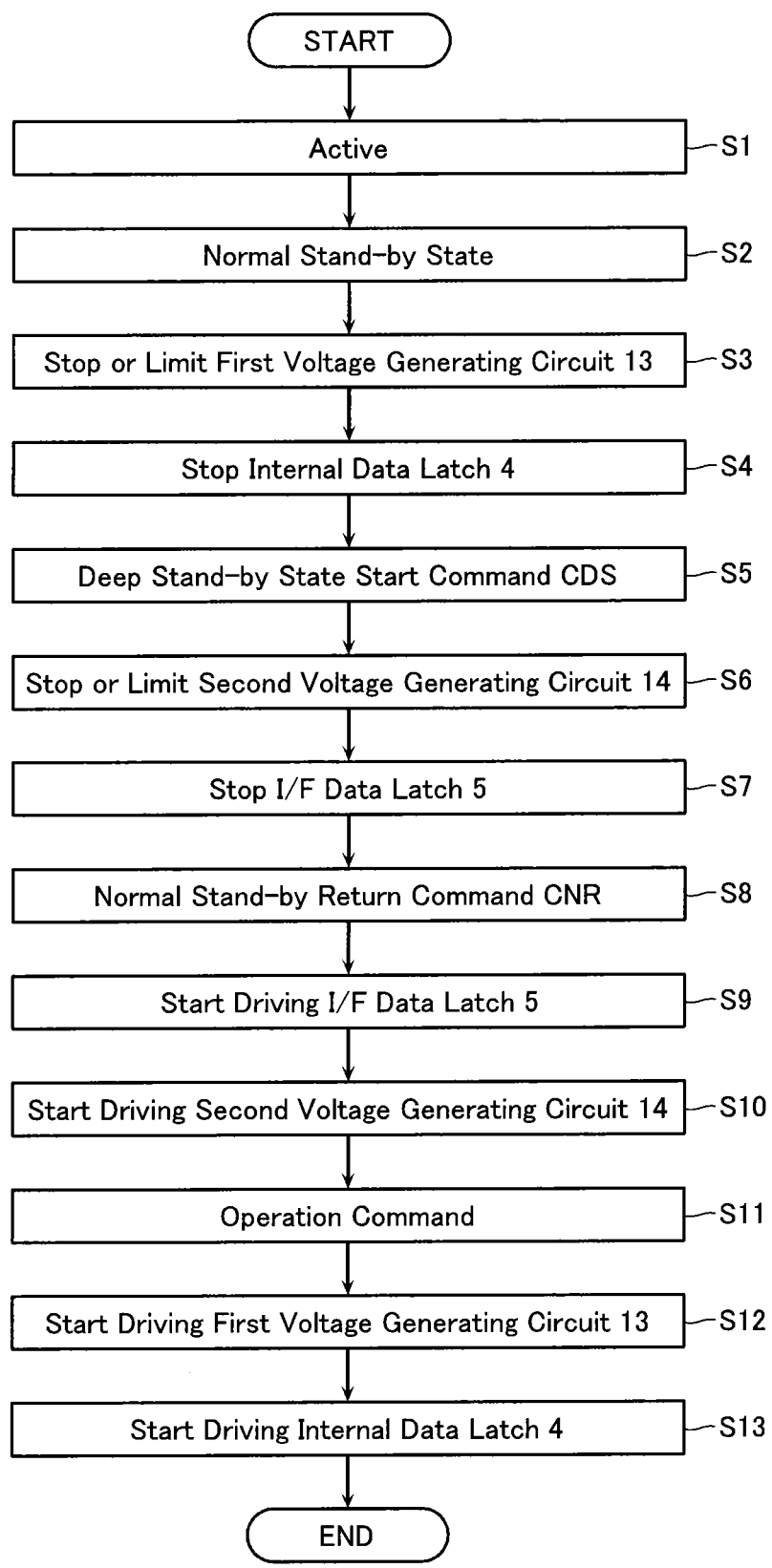
FIG. 3 is a flowchart illustrating an operation in a normal stand-by state and in a deep stand-by state in the first embodiment.
Figure 4:
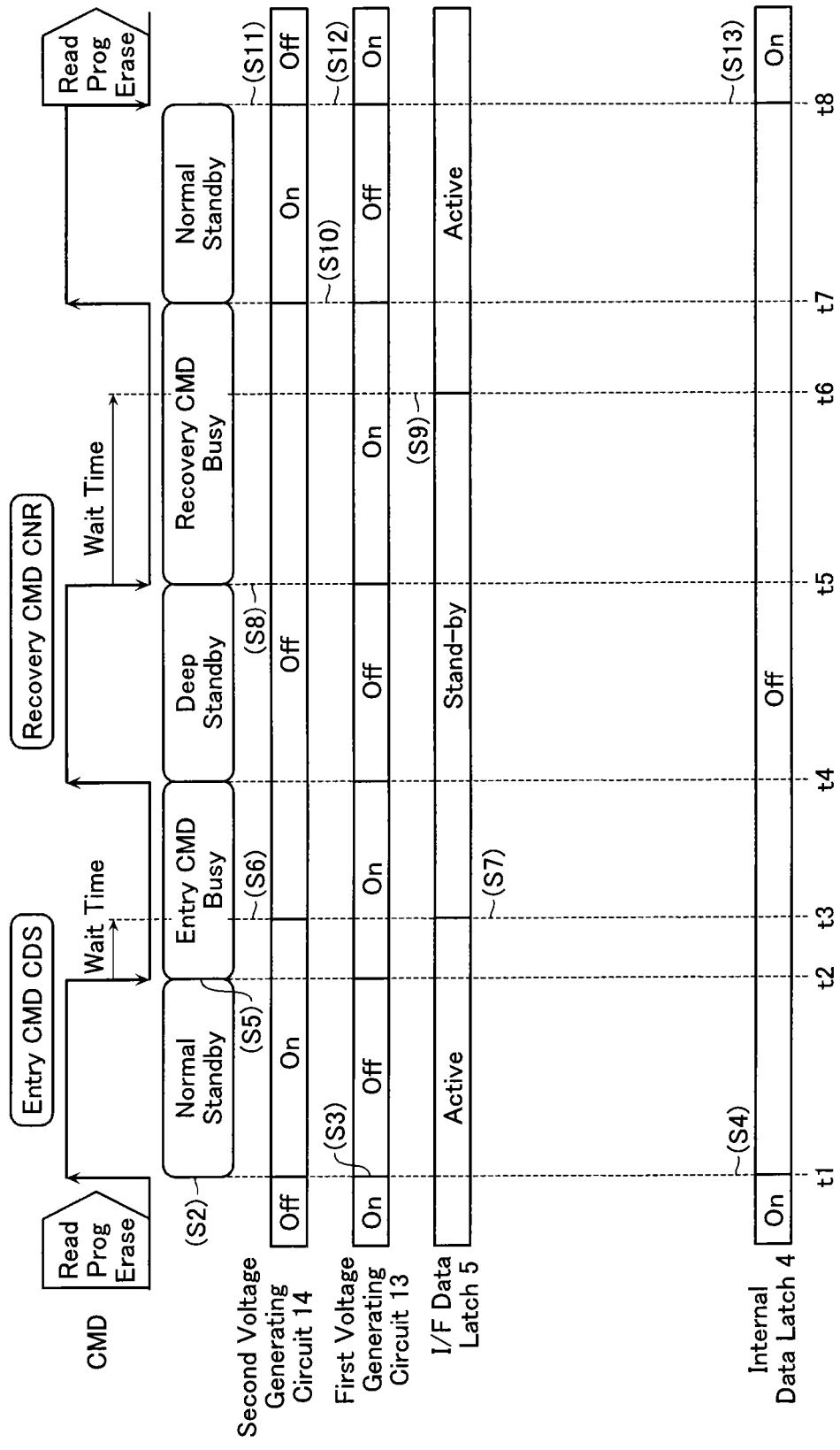
FIG. 4 is a timing chart illustrating an operation in a normal stand-by state and in a deep stand-by state in the first embodiment.

Next, an operation in the normal stand-by state and the deep stand-by state in this embodiment will be described with reference to FIG. 3 and FIG. 4. FIG. 3 is a flowchart that illustrates a flowchart when an operation shifts from the active state to the deep stand-by state via the normal stand-by state, and furthermore, returns to the active state via the normal stand-by state. FIG. 4 is a timing chart thereof.

When various operations (S1) in the active state have been finished at time t1, the memory chip 100 is shifted to the normal stand-by state (S2). This causes the operation of the first voltage generating circuit 13 to be stopped or restrained (S3). In addition, the internal data latch 4 stops its operation, and a current flowing therein is also limited (S4). On the other hand, as shown in FIG. 4, the second voltage generating circuit 14 continues its operation even in the normal stand-by state. The interface data latch 5 supplied with the voltage from the second voltage generating circuit 14 continues its operation, too.

At the next timing (time t2), a command CDS for starting the deep stand-by state is issued from the memory controller 200 (S5). The first voltage generating circuit 13 thereby restarts, for a certain period, driving for a shift to the deep stand-by state (see FIG. 4). Then, operation of the second voltage generating circuit 14 is stopped or restrained at time t3 (S7). This completes a shift to the deep stand-by state. Accordingly, at time t4, operation of the first voltage generating circuit 13 is thereby stopped or restrained.

Then, at time t5, a command CNR indicating return to the normal stand-by state is issued from the memory controller 200 (S8). This causes, first, the first voltage generating circuit 13 to restart its operation for an operation for returning to the normal stand-by state (see FIG. 4), and the interface data latch 5 returns to the active state from the stand-by state (S9). Thereby, recovery to the normal stand-by state is completed. Thus, the first voltage generating circuit 13 thereby stops its operation again (see FIG. 4). On the other hand, the second voltage generating circuit 14 starts its operation (S10).

Thereafter, at time t8, a command for indicating a read/write/or erase operation is issued from the memory controller 200 (S11), the first voltage generating circuit 13 starts its operation (S12), and an operation of the internal data latch 4 is also started. This completes recovery to the active state.

Next, with reference to FIG. 5, a configuration example of the interface data latch will be described.

Figure 5:
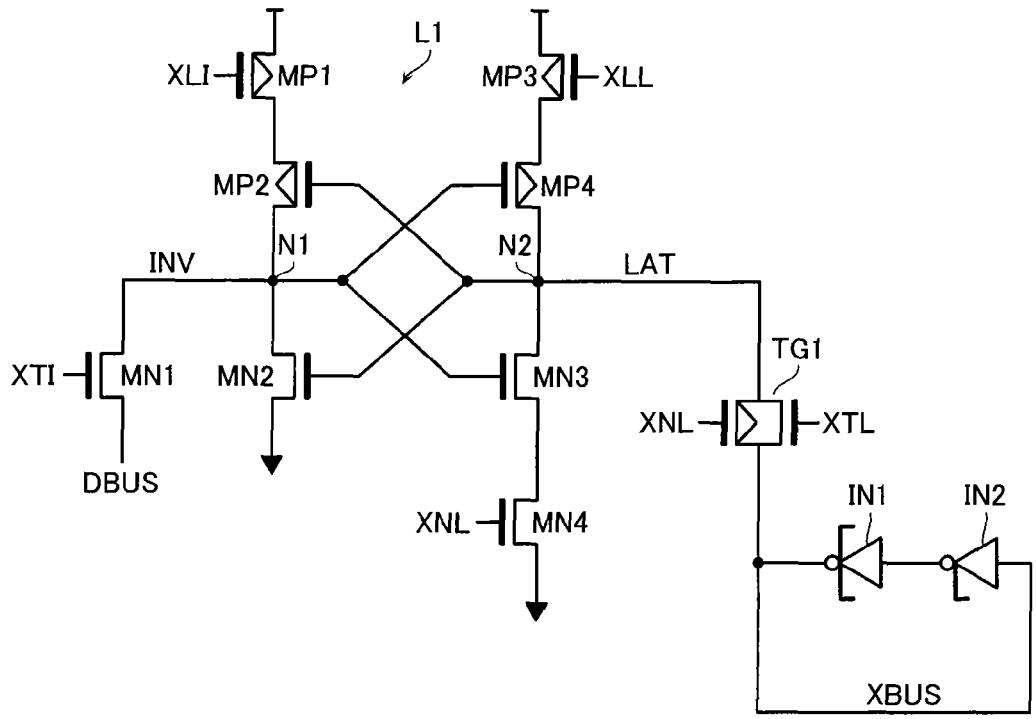
FIG. 5 is circuit diagram illustrating a configuration example of an interface data latch circuit 5.

In FIG. 5, the interface data latch 5 includes a latch circuit L1. The latch circuit L1 includes p-type MOS transistors MP1-MP4 and n-type MOS transistors MN1-MN4. The p-type MOS transistor MP1, MP2, and the n-type MOS transistor MN2 configure one inverter, and the p-type MOS transistors MP3, MP4 and the n-type MOS transistors MN3, MN4 configure another inverter.

By cross-coupling these two inverters, the latch circuit L1 is formed. A signal of a node N1 (gates of the transistors MP4 and MN3) in the latch circuit L1 is called a signal INV, and a signal of a node N2 (gates of the transistors MP2 and MN2) is called a signal LAT.

A source of the transistor MN1 is connected to the node N1. A drain of the transistor MN1 is connected to a data bus DBUS. In addition, a transfer gate TG1 is connected between the node N2 and a data bus XBUS. Gates of the transfer gate TG1 are provided with a signal XNL and a signal XTL, respectively. Note that inverters IN1 and IN2 are connected to the data bus XBUS for holding data. These inverters configures a latch circuit.

A signal XLI is input into a gate of the transistor MP1, and a signal XLL is input into a gate of the transistor MP3. In addition, a signal XTI is input into a gate of the transistor MN1, and a signal XNL is input into a gate of the transistor MN4.

Figure 6:
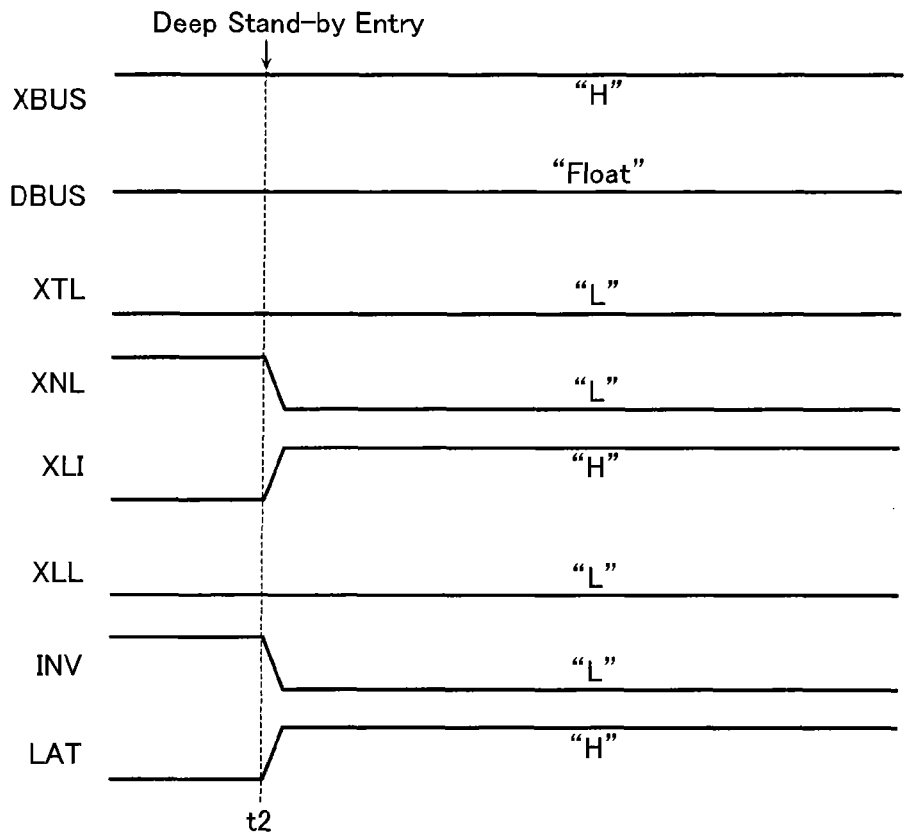
FIG. 6 illustrates changes in signals when switching from a normal stand-by state to a deep stand-by state.
Figure 7:
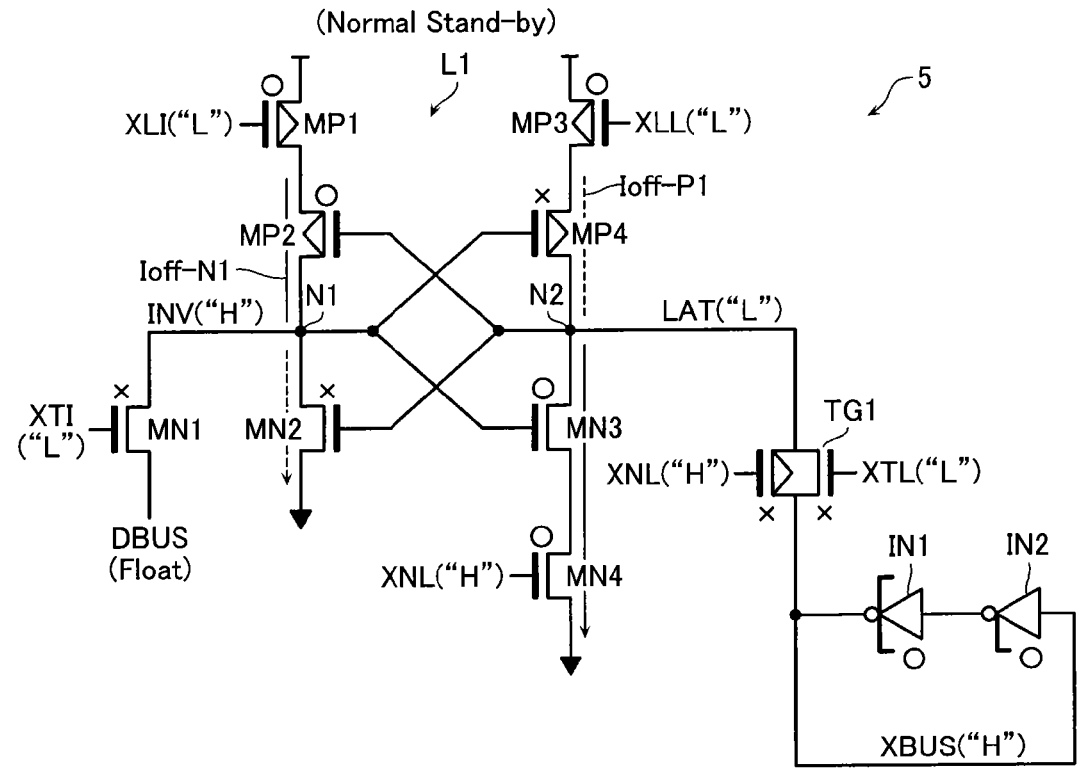
FIG. 7 illustrates an operation of an interface data latch 5 in a normal stand-by state.

Next, operation of the interface latch 5 in this embodiment when it shifts from the normal stand-by state to the deep stand-by state will be described with reference to FIGS. 6 to 8.

Data in the latch circuit may be held without being destroyed. However, when the transistors are in such conductive states, an off current Ioff-N1 flowing in the transistor MN1 has a relatively large value. This is because, in general, an off current in an n-type MOS transistor tends to become larger than that in a p-type MOS transistor. On the other hand, an off current Ioff-P1 flowing in the transistor MP4 is smaller than the off current Ioff-N1. Thus, in the normal stand-by state, the off currents Ioff-N1 and Ioff-P1 flow, but the data continues to be maintained in the latch circuit.

When an operation proceeds from the normal stand-by state to the deep stand-by state at time t2, the signal XNL is switched from "H" to "L", and in contrast, the signal XLI is switched from "L" to "H".

Figure 8:
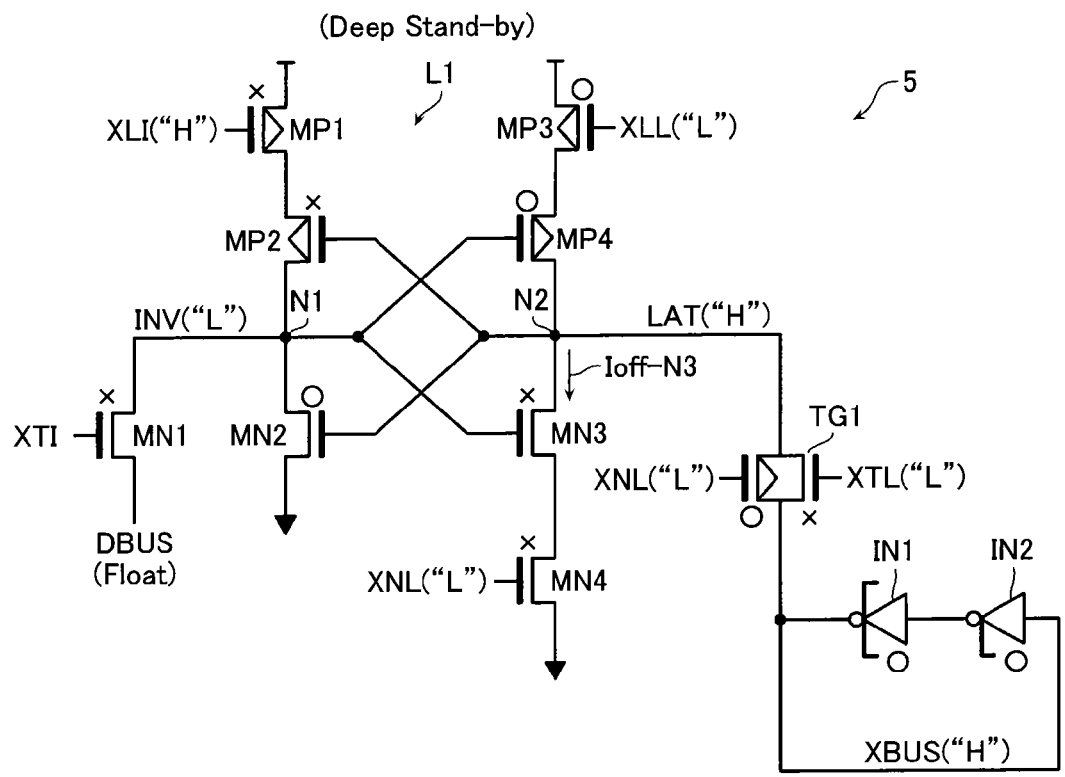
FIG. 8 illustrates an operation of an interface data latch 5 in a deep stand-by state.

FIG. 8 illustrates a state of the interface data latch 5 in the deep stand-by state.

The transfer gate TG1 changes its conduction state due to the above-described signal change. This causes the signal LAT to be switched to "H", and the signal INV is switched to "L". That is, data held in the interface data latch 5 is destroyed.

However, an off current flowing through the interface data latch 5 in the deep stand-by state is highly suppressed compared to an off current flowing through the interface data latch 5 in the normal stand-by state. In the deep stand-by state, both of the transistors MN3 and MN4 are switched to a non-conductive state. Both of the transistors MN3 and MN4 are n-type MOS transistors, but they are connected in series. Accordingly, an off current Ioff-N3 flowing therein becomes smaller than the above-mentioned off current Ioff-N1. Thus, as a whole, an off current may be made small.

Advantage

As discussed above, according to this embodiment operation of the internal data latch is limited when an operation shifts to the deep stand-by mode. In addition, operation of the interface data latch also may be limited. This allows power consumption to be greatly lowered.

Second Embodiment

Next, a semiconductor memory device according to the second embodiment will be described with reference to FIG. 9 to FIG. 11.

The structure of the semiconductor memory device of the second embodiment is the same as that of the first embodiment (FIG. 1, FIG. 2, and FIG. 5). In addition, operation thereof is also basically the same as that of the first embodiment (FIG. 3 and FIG. 4). However, this embodiment is different from the first embodiment in operation of the interface data latch 5 when an operation shifts from the normal stand-by state to the deep stand-by state (FIG. 6 to FIG. 8).

Operation of the interface latch 5 in the second embodiment when it shifts from the normal stand-by state to the deep stand-by state will be described with reference to FIGS. 9 to 11. FIG. 9 is a timing chart of various signals. FIG. 10 is a circuit diagram illustrating a state of the interface data latch 5 in the normal stand-by state. FIG. 10 is a circuit diagram showing the states of interface data latch 5 in the normal stand-by state. FIG. 11 is a circuit diagram showing a state of the interface data latch 5 in the deep stand-by state.

Figure 9:
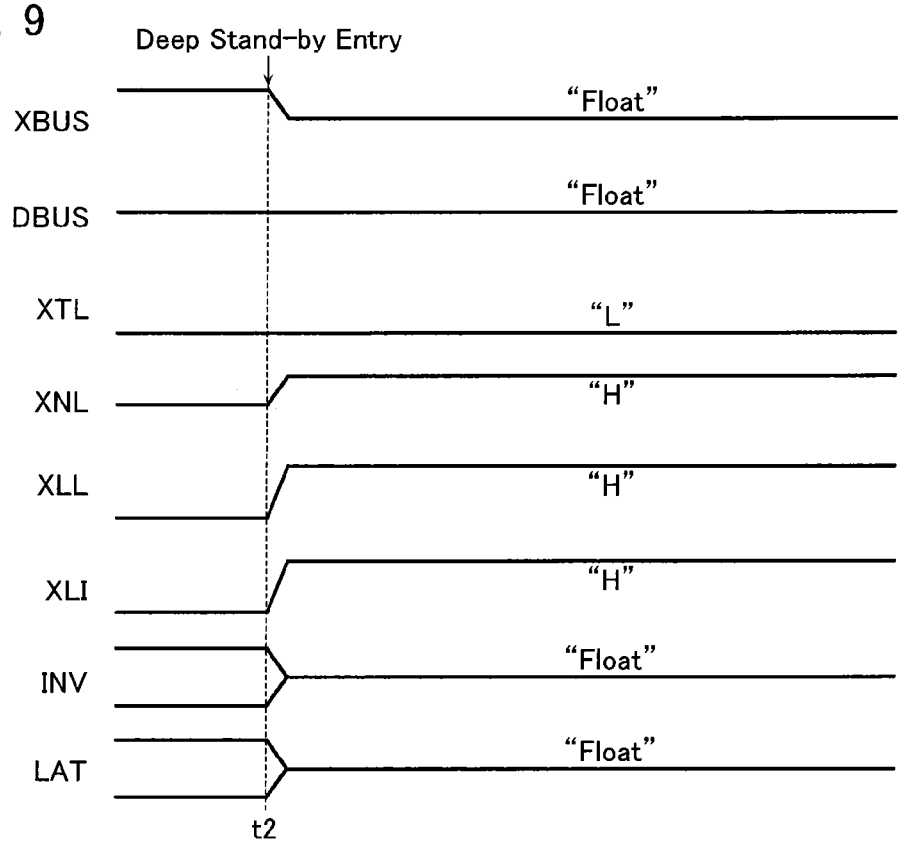
FIG. 9 illustrates changes in signals when switching from a normal stand-by state to a deep stand-by state in the second embodiment.

As illustrated in FIG. 9, in the normal stand-by state, each of the signals is in a state prior to time t2 in FIG. 9.

The data bus XBUS is switched between "H" and "L" depending on input data in the active state (not illustrated), whereas it is fixed to "H" in the normal stand-by state. On the other hand, the data bus DBUS is similarly switched between "H" and "L" depending on input data in the active state (not illustrated), whereas it is held in a floating state in the normal stand-by state.

In addition, the signals XTL, XLL, and XLI are set at "L" in the normal stand-by state. The signal XNL is set at "L" in the normal stand-by state.

Furthermore, the signals INV and LAT from the nodes N1 and N2 are set at "H" and "L", or "L" and "H", respectively.

Figure 10:
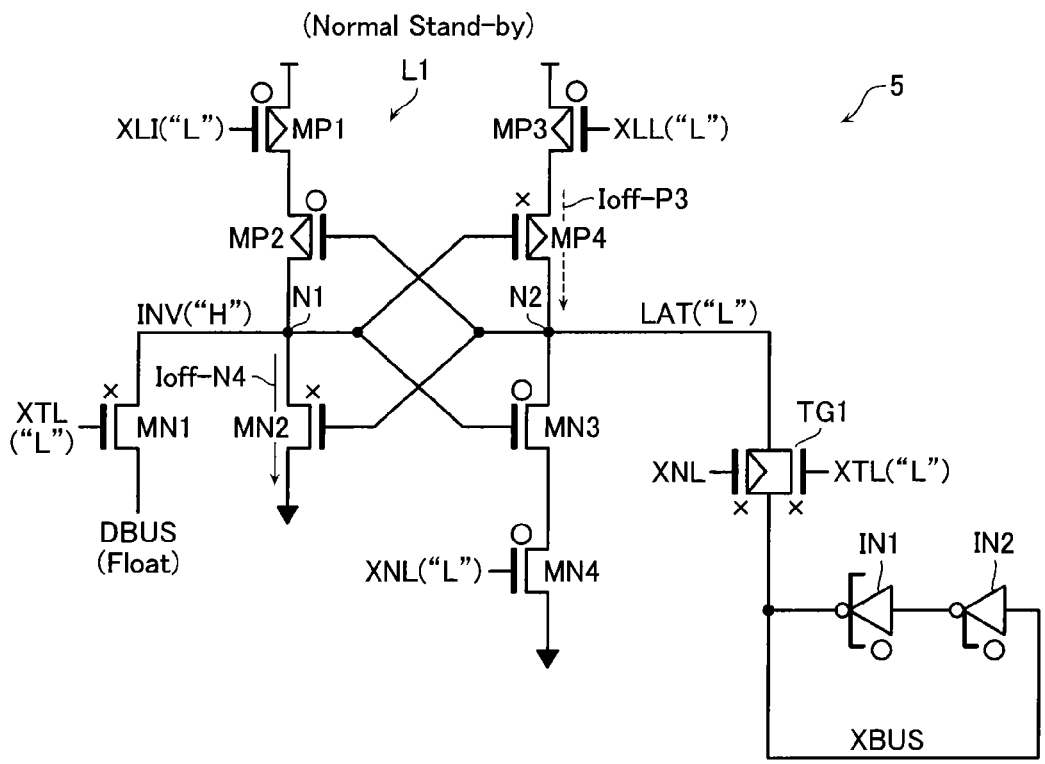
FIG. 10 illustrates an operation of an interface data latch 5 in a normal stand-by state in the second embodiment.

As shown in FIG. 10, this allows the transistors MP1, MP2, and MP3 to be switched to a conductive state in the normal stand-by state. In contrast, the transistor MP4 is switched to a non-conductive state.

In addition, although the transistor MN2 is switched to a non-conductive state, the transistors MN3 and MN4 are switched to a conductive state. Data held in the latch circuit is not destroyed but maintained therein. However, if above-described transistors are in such a conductive state, an off current Ioff-N4 flowing through the transistor MN1 has a relatively large value.

On the other hand, an off current Ioff-P3 flowing in the transistor NP4 becomes smaller than the above-mentioned off current Ioff-N4. In this way, the off currents Ioff-N4 and Ioff-P3 flow in the normal stand-by state, but the latch circuit keeps maintaining data therein.

When an operation shifts from such the normal stand-by state to the deep stand-by state at time t2, the signals XLI and XLL switch from "L" to "H".

Figure 11:
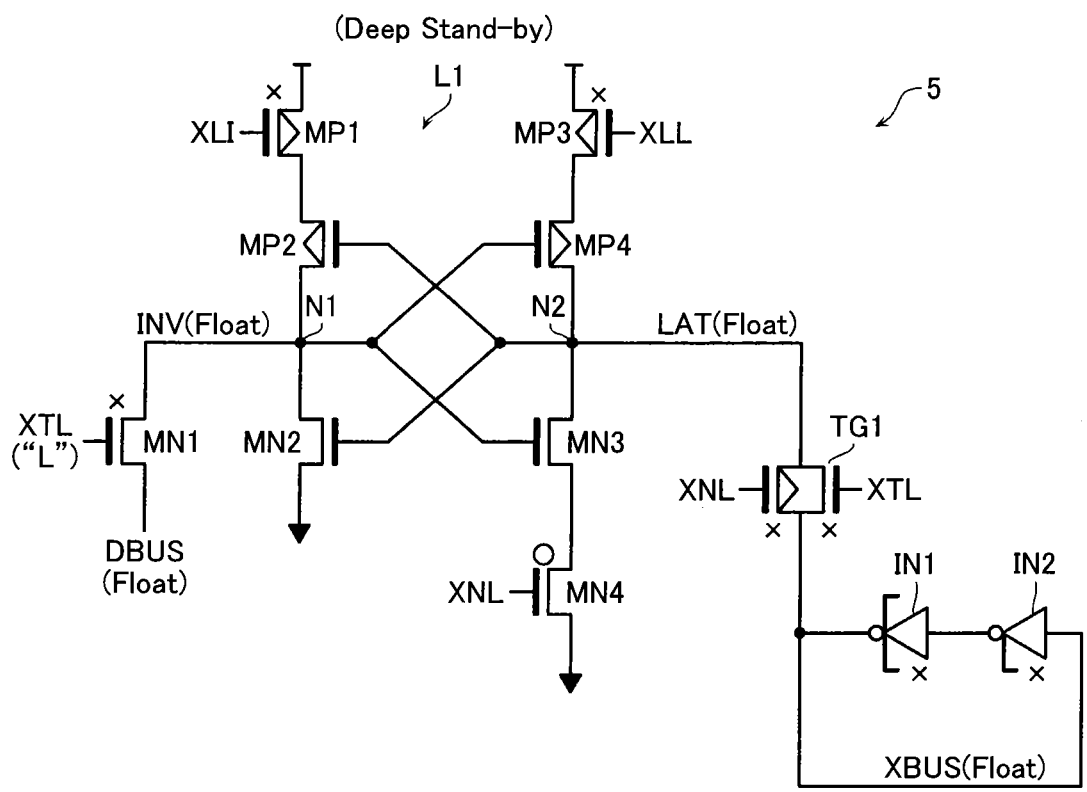
FIG. 11 illustrates an operation of an interface data latch 5 in a deep stand-by state in the second embodiment.

FIG. 11 illustrates a state of the interface data latch 5 in the deep stand-by state. The above-described signal change causes the transistors TP1, TP2 and TP3 to be switched to a non-conductive state, whereby the nodes N1 and N2 both switch to a floating state. That is, data held in the interface data latch 5 is destroyed. The latch circuits IN1 and IN2 in the data bus XBUS is switched to a non-active state, Whereby the data bus XBUS is switched to a floating state.

In this case, an off current flowing in the interface data latch 5 in the deep stand-by state is highly suppressed compared to an off current flowing in the interface latch circuit 5 in the normal stand-by state. In the deep stand-by state, all of the transistors MP1 to MP4 are switched to a non-conductive state. Accordingly, the off current becomes very small. An off current flowing in the n-type MOS transistor MN3 is small, because the n-type MOS transistor MN4 is in a conductive state, while the p-type MOS transistors on an upstream side thereof are all in a non-conductive state.

Also with this embodiment, the same advantage as that of the first embodiment may be obtained.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array including memory cells;
   a first latch circuit operative to temporarily hold data;
   a second latch circuit operative to temporarily hold a control signal; and
   a control circuit configured to execute a first operation, the first operation including a write operation or a read operation,
   the control circuit being operative to stop an operation of the first latch circuit without stopping an operation of the second latch circuit after the first operation has been finished, and stop an operation of the second latch circuit when the semiconductor memory device receives a first command from external to the semiconductor memory device.

2. The semiconductor memory device according to claim 1, further comprising:
   a first voltage generator configured to supply a voltage to the first latch circuit, and
   a second voltage generator configured to supply a voltage to second latch circuit,
   wherein the control circuit is operative to stop an operation on the first voltage generator after the first operation has been finished, and stop an operation on the second voltage generator when the semiconductor memory device receives the first command.

3. The semiconductor memory device according to claim 2, wherein
   the control circuit is operative to stop an operation on the second voltage generator after causing the first voltage generator to return to a driven state.

4. The semiconductor memory device according to claim 1, further comprising:
   a command interface circuit operative to temporarily hold the first command, and
   a third voltage generator operative to generate a voltage for driving the command interface circuit.

5. The semiconductor memory device according to claim 4, wherein
   the third voltage generator is configured to continue generating a voltage irrespective of the presence or absence of the first command.

6. The semiconductor memory device according to claim 4, further comprising:
   a first voltage generator configured to supply a voltage to the first latch circuit, and
   a second voltage generator configured to supply a voltage to the second latch circuit,
   wherein the control circuit is operative to stop an operation on the first voltage generator after the first operation has been finished, and stop an operation on the second voltage generator when the semiconductor memory device receives the first command.

7. The semiconductor memory device according to claim 6, wherein
   the control circuit is operative to stop an operation on the second voltage generator after causing the first voltage generator to return to a driven state.

8. The semiconductor memory device according to claim 1, wherein
   the second latch circuit is configured by cross-coupling two inverter circuits, and
   one of the two inverter circuits includes two n-type MOS transistors that are serially-connected, both of the n-type MOS transistors being changed to a non-conductive state when the first command is issued.

9. The semiconductor memory device according to claim 1, wherein
   the second latch circuit is configured by cross-coupling two inverter circuits,
   an input terminal of one of the two inverter circuits is connected to a data bus through a transfer gate, and
   the data bus comprises a latch circuit operative to hold data, and is configured to be switched to a non-active state when the first command is issued.

10. A semiconductor memory device comprising a memory chip and a memory controller operative to control the memory chip, the memory chip comprising:
    a memory cell array including memory cells;
    a first latch circuit operative to hold data;
    a second latch circuit operative to temporally hold a control signal; and
    a control circuit operative to execute a first operation, the first operation including a write operation or a read operation,
    the control circuit being operative to stop an operation of the first latch circuit after the first operation has been finished, and stop an operation of the second latch circuit when the semiconductor memory device receives a first command from the memory controller.

11. The semiconductor memory device according to claim 10, further comprising:
    a first voltage generator configured to supply a voltage to the first latch circuit, and
    a second voltage generator configured to supply a voltage to the second latch circuit,
    wherein the control circuit is operative to stop an operation on the first voltage generator after the first operation has been finished, and stop an operation on the second voltage generator when the semiconductor memory device receives the first command.

12. The semiconductor memory device according to claim 11, wherein
    the control circuit is operative to stop an operation on the second voltage generator after causing the first voltage generator to return to a driven state.

13. The semiconductor memory device according to claim 10, further comprising:

a command interface circuit operative to temporarily hold the first command, and a third voltage generator operative to generate a voltage for driving the command interface circuit.

14. The semiconductor memory device according to claim 13, wherein the third voltage generator is configured to continue generating a voltage irrespective of the presence or absence of the first command.

15. The semiconductor memory device according to claim 13, further comprising:

a first voltage generator configured to supply a voltage to the first latch circuit, and a second voltage generator configured to supply a voltage to the second latch circuit, wherein the control circuit is operative to stop an operation on the first voltage generator after the first operation has been finished, and stop an operation on the second voltage generator, when the semiconductor memory device receives the first command.

16. The semiconductor memory device according to claim 15, wherein the control circuit is operative to stop an operation on the second voltage generator after causing the first voltage generator to return to a driven state.

17. The semiconductor memory device according to claim 10, wherein the second latch circuit is configured by cross-coupling two inverter circuits, and one of the two inverter circuits includes two n-type MOS transistors that are serially-connected, both of the n-type MOS transistors being changed to a non-conductive state when the first command is issued.

18. The semiconductor memory device according to claim 10, wherein the second latch circuit is configured by cross-coupling two inverter circuits, an input terminal of one of the two inverter circuits is connected to a data bus through a transfer gate, and the data bus comprises a latch circuit operative to hold data, and is configured to be switched to a non-active state when the first command is issued.

* * * * *